United States Patent
Ballandras et al.

(10) Patent No.: US 12,113,515 B2
(45) Date of Patent: Oct. 8, 2024

(54) ACOUSTIC WAVE SENSOR AND INTERROGATION OF THE SAME

(71) Applicant: Soitec, Bernin (FR)

(72) Inventors: Sylvain Ballandras, Besançon (FR);
Thierry LaRoche, Besançon (FR);
Julien Garcia, Besançon (FR)

(73) Assignee: Soitec, Bernin (FR)

( * ) Notice: Subject to any disclaimer, the term of this patent is extended or adjusted under 35 U.S.C. 154(b) by 283 days.

(21) Appl. No.: 17/599,149

(22) PCT Filed: Mar. 19, 2020

(86) PCT No.: PCT/EP2020/057666
§ 371 (c)(1),
(2) Date: Sep. 28, 2021

(87) PCT Pub. No.: WO2020/200822
PCT Pub. Date: Oct. 8, 2020

(65) Prior Publication Data
US 2022/0173721 A1    Jun. 2, 2022

(30) Foreign Application Priority Data
Mar. 29, 2019 (FR) .................................... 1903330

(51) Int. Cl.
*H03H 9/64* (2006.01)
*G01K 11/26* (2006.01)
(Continued)

(52) U.S. Cl.
CPC ........... *H03H 9/642* (2013.01); *G01K 11/265* (2013.01); *G01S 13/755* (2013.01); *G06K 7/00* (2013.01); *G06K 19/0675* (2013.01)

(58) Field of Classification Search
None
See application file for complete search history.

(56) References Cited

U.S. PATENT DOCUMENTS 4,859,991 A * 8/1989 Watkins ............. G08B 13/2471
333/167
6,107,910 A    8/2000 Nysen
(Continued)

FOREIGN PATENT DOCUMENTS

DE       10233636 A1 *  2/2004  ............. G01K 11/22
WO       2004/015383 A1   2/2004

OTHER PUBLICATIONS

French Search Report and Opinion for French Application No. 1903330 dated Dec. 12, 2019, 10 pages.
(Continued)

*Primary Examiner* — Mohamed Barakat
*Assistant Examiner* — Rufus C Point
(74) *Attorney, Agent, or Firm* — TraskBritt

(57) ABSTRACT

A method of interrogating an acoustic wave sensor comprises transmitting, by an interrogator, an interrogation radiofrequency signal to the acoustic wave sensor by way of a transmission antenna, receiving, by the interrogator, a response radiofrequency signal from the acoustic wave sensor by way of a reception antenna, and processing by a processing means of the interrogator the received response radiofrequency signal to obtain in-phase and quadrature components both in the time domain and the frequency domain, determining by the processing means perturbations of the obtained in-phase and quadrature components both in the time domain and the frequency domain and determining by the processing means a value of a measurand based on the detected perturbations.

18 Claims, 3 Drawing Sheets

(51) Int. Cl.
*G01S 13/75* (2006.01)
*G06K 7/00* (2006.01)
*G06K 19/067* (2006.01)

(56) References Cited

U.S. PATENT DOCUMENTS

| | | | | |
|---|---|---|---|---|
| 7,777,625 B1 * | 8/2010 | Puccio | ............... | G06K 19/0672 |
| | | | | 340/568.1 |
| 2002/0103636 A1 * | 8/2002 | Tucker | .................... | G10L 25/78 |
| | | | | 704/205 |
| 2006/0071983 A1 * | 4/2006 | Stearns | ............... | B41J 2/14008 |
| | | | | 347/68 |
| 2009/0314104 A1 * | 12/2009 | Lohr | .................... | G01L 3/1428 |
| | | | | 73/862.338 |
| 2010/0250170 A1 | 9/2010 | Kalinin et al. | | |

OTHER PUBLICATIONS

International Search Report for International Application No. PCT/EP2020/057666 dated Jun. 15, 2020, 3 pages.
International Written Opinion for International Application No. PCT/EP2020/057666 dated Jun. 15, 2020, 6 pages.
Korean Notice of Preliminary Rejection for Application No. 10-2021-7035216 dated Jan. 12, 2024, 6 pages.

* cited by examiner

ACOUSTIC WAVE SENSOR AND INTERROGATION OF THE SAME

CROSS-REFERENCE TO RELATED APPLICATIONS

This application is a national phase entry under 35 U.S.C. § 371 of International Patent Application PCT/EP2020/057666, filed Mar. 19, 2020, designating the United States of America and published as International Patent Publication WO 2020/200822 A1 on Oct. 8, 2020, which claims the benefit under Article 8 of the Patent Cooperation Treaty to French Patent Application Serial No. FR1903330, filed Mar. 29, 2019.

TECHNICAL FIELD

The present disclosure relates to passive sensors of the acoustic wave type and, in particular, a passive surface acoustic wave or bulk acoustic wave sensor and the interrogation thereof.

BACKGROUND

Sensors are of growing importance and become more and more ubiquitous in every-day life. Microelectromechanical systems (MEMS) are an attractive option to answer the demand for increased performance of sensors along with decreased sizes and costs. Surface acoustic wave (SAW) sensors, and to a lower extent bulk acoustic wave (BAW) sensors or Lamb wave or Love wave acoustic sensors, offer particularly advantageous options due to a wide variety of measurable ambient parameters including temperature, pressure, strain and torque, for example.

Acoustic wave sensors utilize the piezoelectric effect to transduce an electrical signal into a mechanical/acoustic wave. SAW-based sensors are built on single-crystal piezoelectric materials like quartz ($SiO_2$), lithium niobate ($LiNbO_3$), lithium tantalate ($LiTaO_3$), langasite (LGS) or poly-crystal piezoelectric materials like aluminum nitride (AlN) or zinc oxide (ZnO), in particular, deposited on silicon, or even on a Piezo-On-Insulator (POI) composite material comprising a layer of piezoelectric material, in particular, a single-crystal material, such as, for example, lithium, tantalate or lithium niobate, bonded to a support substrate as, for instance, silicon, if necessary by means of a bonding layer, as, for instance, a silicon oxide layer (in general, any combination of a single crystal piezoelectric material with non-piezoelectric substrates used for their specific properties like thermal stability or acoustic quality). A transducer, in case of surface acoustic waves an interdigitated transducer (IDT), converts the electrical energy of the electrical signal into acoustic wave energy. The acoustic wave travels across the surface (or bulk) of a device substrate via the so-called delay line to another transducer, in particular, an IDT, that converts the acoustic wave back to an electrical signal that can be detected. In some devices mechanical absorbers and/or reflectors are provided in order to prevent interference patterns and reduce insertion loss. In some devices the other (output) IDT is replaced by a reflector that reflects the generated acoustic wave back to the (input) IDT that can be coupled to an antenna for remote interrogation of the sensor device. Advantageously, the measurements can be performed completely passively, i.e., the sensor may not be powered by a power source.

A particular class of acoustic sensors comprises resonators exhibiting resonance frequencies that vary according to varying ambient conditions. A conventional surface wave resonator, for example, comprises an electroacoustic transducer with interdigitated combs arranged between Bragg mirrors. At the resonance frequency, the condition of synchronism between the reflectors is satisfied making it possible to obtain a coherent addition of the different reflections, which occur under the reflectors. A maximum of acoustic energy is then observed within the resonant cavity and, from an electrical point of view, a maximum of amplitude of the current admitted by the transducer is observed. Differential acoustic wave sensors may comprise two or more resonators exhibiting different resonance frequencies or a resonator working in multimode (several resonance frequencies), wherein differences in the measured frequencies reflect variations in the ambient parameters as, for example, temperature or strain.

However, despite the recent engineering process, the entire interrogation process wherein an interrogator transmits an appropriate radiofrequency signal that is received by the acoustic wave sensor via a reception antenna and converted by a transducer into a surface acoustic wave (or bulk wave, in the case of devices of a bulk acoustic wave sensor type) that is converted into a radiofrequency signal being re-transmitted via an emission antenna and received and analyzed by the interrogator still poses demanding technical problems. Particularly, radiofrequency noise present in the commonly used ISM (Industrial, Scientific, Medical) bands, for example, in bands with a center frequency of 434 MHz or 2.45 GHz, causes reading/interpretation errors affecting the quality of the generation and analysis of response spectra provided by the sensor devices. Particularly, intermittent parasites/spurious echoes such as Wi-Fi, BLUETOOTH® or GSM emission may negatively affect the quality of the spectral response leading to reading errors and obstruction of the wanted signal. Permanent background white noise may negatively affect time domain measurements. Another problem is related to relative motions between the sensor device and the interrogator that causes parasites thereby affecting the resonance frequency of resonator type acoustic wave sensors.

Therefore, it is an object of the present disclosure to provide means for interrogating an acoustic wave sensor with an increased signal quality, for example, increased signal-to-noise as compared to the art.

BRIEF SUMMARY

The present disclosure addresses the above-mentioned object by providing a method of interrogating an acoustic wave sensor (and sensing a measurand by means of the acoustic wave sensor), comprising the steps of transmitting, by an interrogator, an interrogation radiofrequency signal to the acoustic wave sensor that is to be interrogated by means of a transmission antenna (the acoustic wave sensor receiving the interrogation radiofrequency signal by its own antenna); receiving, by the interrogator, a response radiofrequency signal from the acoustic wave sensor (transmitted by an antenna comprised in the acoustic sensor device and that may be or not be identical with the antenna used for receiving the interrogation radiofrequency signal) by means of a reception antenna (that may be or not be the same as the transmission antenna); and processing by a processing means (for example, being or comprising a CPU or microcontroller) of the interrogator the received response radiofrequency signal to obtain in-phase and quadrature components both in the time domain and the frequency domain; detecting by the processing means perturbations of the obtained in-phase and quadrature components both in the time domain and the frequency domain; and determining by the processing means a value of a measurand based on the detected perturbations the measurand being an ambient parameter, for example, a temperature, strain, pressure or torque of a rotating axis.

The acoustic wave sensor may be a surface acoustic wave sensor or a bulk acoustic wave sensor and may comprise a delay line structure as well as a single or multiple resonator structure.

Accordingly, the processing/analyzing of the received response radiofrequency signal is performed by determining the in-phase and quadrature components in both the time and the frequency domains and depending on the noise/perturbations that may be present in at least one of the domains the further processing is performed in the time domain or the frequency domain or in both of the domains mentioned.

According to an embodiment, the value of the measurand is determined in the time domain, if the perturbations in the frequency domain exceed a first predetermined threshold and vice versa the value of the measurand is determined in the frequency domain, if the perturbations in the time domain exceed a second predetermined threshold (for example, the second threshold is the same as the first threshold).

The received response radiofrequency signal may be typically processed in frames and frames comprising perturbations exceeding a predetermined threshold may be excised as defective frames when determining the value of the measurand. By excising defective frames the overall processing is more robust and results in more reliable results for the measured values of the measurand.

In particular, the value of the measurand can be determined in the time domain and/or the frequency domain at least partly based on a phase of the received response radiofrequency signal. The phase is very sensitive to variations in the measurand and can, therefore, advantageously be used for measuring the measurand in both the time and the frequency domain. However, when detecting the resonance frequencies as local maxima of the spectrum modulus, one can demonstrate that the phase corresponding to the resonance frequency is zero by necessity, according the definition of resonance (all contributions in the resonator are summed in phase at the resonance frequency). In the time domain, if the sensor exhibits any free space traveling, for instance, in a delay line or in a cavity resonator, the phase of the time domain signal corresponding to a maximum amplitude is changing due to environmental parameter variations or sensor position.

If both a) the perturbations in the time domain do not exceed the second predetermined threshold and b) the perturbations in the frequency domain do not exceed the first predetermined threshold, a translational and/or a rotational motion of the acoustic wave sensor with respect to the interrogator based on the obtained in-phase and quadrature components both in the time domain and the frequency domain can be determined. Thereby, effects caused by the motion of the acoustic wave sensor with respect to the interrogator can be taken into account and/or an initial position of the acoustic sensor can be reliably determined.

The determining of the perturbations in all of the above-described embodiments may comprise dynamically determining the variances or standard deviations of the obtained in-phase and quadrature components over respective entire frames. The variance or standard deviation of the in-phase components I and the quadrature components Q over a particular entire frame of N consecutively sampled frames, for example, the 1st frame, is calculated and represents an initial threshold. For the following frames (N+1, N+2, etc.), again, the variances or standard deviations of the in-phase components and the quadrature components over the respective entire frames (both in the time domain and the frequency domain) are calculated. If the variances or standard deviations for the following frames are decreasing, the threshold value will be updated by the variances or standard deviations of the following frames. When a variance or standard deviation of a following frame is larger than the one of the previous frame the variance or standard deviation of the previous frame is used as the threshold value. In the subsequently performed analysis, frames that exceed the thus obtained threshold are rejected and not considered in the process step of determining a value of a measurand based on the determined perturbations of the inventive method of interrogating an acoustic wave sensor.

The above-mentioned object is also addressed by providing a system for sensing a measurand, comprising an acoustic wave sensor (for example, a surface acoustic wave or a bulk acoustic wave sensor having one or more antennas); and an interrogator comprising a processing means, a transmission antenna and a reception antenna (which may be realized by one and the same antenna or not) and configured for transmitting an interrogation radiofrequency signal to the acoustic wave sensor by means of the transmission antenna and for receiving a response radiofrequency signal from the acoustic wave sensor by means of the reception antenna; wherein the processing means of the interrogator is configured for processing the received response radiofrequency signal to obtain in-phase and quadrature components both in the time domain and the frequency domain; detecting perturbations of the obtained in-phase and quadrature components both in the time domain and the frequency domain; and determining a value of a measurand (ambient parameter) based on the detected perturbations.

According to an embodiment, the processing means is configured for determining the value of the measurand in the time domain, if the perturbations in the frequency domain exceed a predetermined first threshold and the value of the measurand is determined in the frequency domain, if the perturbations in the time domain exceed a predetermined second threshold (for example, being the same as the first predetermined threshold). Further, the processing means may be configured for processing the received response radiofrequency signal in frames and wherein frames comprising perturbations exceeding a predetermined threshold are excised when determining the value of the measurand. Furthermore, the processing means may be configured for determining the value of the measurand in the time domain and/or the frequency domain at least partly based on a phase (and the temporal change thereof during a monitoring process) of the received response radiofrequency signal. When detecting the resonance frequencies as local maxima of the spectrum modulus, one can demonstrate that the phase corresponding to the resonance frequency is zero by necessity, according the definition of resonance (all contributions in the resonator are summed in phase at the resonance frequency). In the time domain, if the sensor exhibits any free space traveling, for instance, in a delay line or in a cavity resonator, the phase of the time domain signal corresponding to a maximum amplitude is changing due to environmental parameter variations or sensor position.

According to a further embodiment, the processing means of the interrogator is configured for determining a translational and/or a rotational motion of the acoustic wave sensor with respect to the interrogator based on the obtained in-phase and quadrature components both in the time domain and the frequency domain, if both a) the perturbations in the time domain do not exceed the second predetermined threshold and b) the perturbations in the frequency domain do not exceed the first predetermined threshold. Furthermore, the processing means may be configured for determining the perturbations (dynamically) by determining the variances or standard deviations of the obtained in-phase and quadrature components over respective entire frames.

In all of the above-described embodiments, the acoustic wave sensor may comprise one transducer configured for converting the interrogation radiofrequency signal into an acoustic wave, in particular, a surface acoustic wave, two resonance cavities and Bragg mirror structures. Thereby, a hybrid acoustic wave sensor can be provided that allows for combining a delay line architecture with a resonance architecture and readily provides for detection data that can be processed both in the time domain and the frequency domain. In all of the above-described embodiments, the system may be configured to carry out the steps of the embodiments of the inventive method of interrogating an acoustic wave sensor described above.

BRIEF DESCRIPTION OF THE DRAWINGS

Additional features and advantages of the present disclosure will be described with reference to the drawings. In the description, reference is made to the accompanying figures that are meant to illustrate preferred embodiments of the present disclosure. It is understood that such embodiments do not represent the full scope of the present disclosure.

DETAILED DESCRIPTION

The present disclosure provides techniques for the remote interrogation of passive acoustic wave sensors, in particular, surface acoustic wave sensor devices, wherein the techniques are characterized by a high signal-to-noise ratio. The techniques can be applied to any interrogators that are configured to determine a spectral and impulse response from an interrogated acoustic wave sensor. While in the art the response radiofrequency signal received by the interrogator is processed in either the time or frequency (spectral) domain, it is provided herein a technique that, in principle, offers processing in both domains depending on actual interrogation conditions, for example, noise perturbations. In particular, if it is determined that there are heavy parasites present in one of the domains, the other one of the domains can be used for processing/analyzing the wanted signal.

Figure 1:
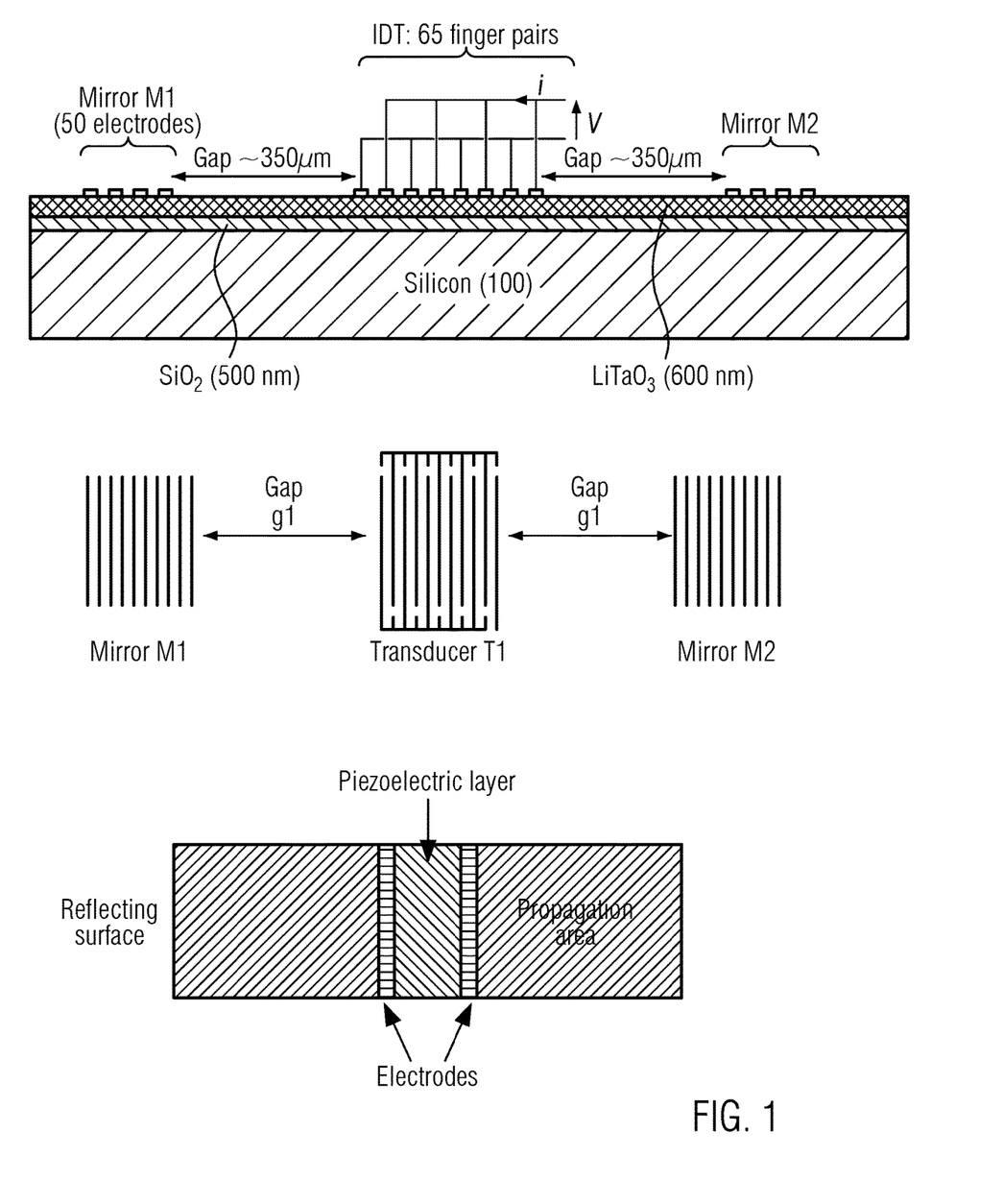
FIG. 1 illustrates an acoustic wave sensor device wherein the present disclosure can be implemented according to an embodiment.

FIG. 1 illustrates an exemplary hybrid acoustic wave sensor device wherein a) the delay line structure wherein a measurand affects the velocity of the propagating acoustic wave and/or the geometrical length of the propagation path and b) the resonance approach wherein the resonance frequency/frequencies is/are affected by the measurand, each of which is known on its own in the art, are implemented in combination with each other. The hybrid acoustic wave sensor device comprises one transducer for converting a received radiofrequency signal into an acoustic wave, in the present case, a surface acoustic wave (SAW). However, the present disclosure is not limited to SAW sensors and can also be applied to bulk acoustic wave sensors, for example. Further, the hybrid acoustic wave sensor device comprises two cavities and mirrors. The sensor device provides for a high quality factor Qf corresponding to the ratio between the central frequency and the width at half maximum of the band pass used in the interrogation process. The high quality factor Qf ensures a sufficiently high resolution of the detected data samples. Both in the time domain and the frequency domain one can obtain comb shaped responses in the response radiofrequency signal. In a differential mode of operation signals obtained from the delay line structure can be compared with signals obtained from the resonator structure.

An interrogation signal transmitted by an interrogator may, for example, represent a frequency stepped continuous wave signal or linear frequency modulated continuous wave signal. The response radiofrequency signal transmitted by the sensor device is received by the interrogator and can be processed by the interrogator in the time domain or the frequency domain wherein the processing comprises the determination of the in-phase and quadrature components (real and imaginary parts) of the response radiofrequency signal. The received response radiofrequency signal may be mixed by a processing means with the interrogation radiofrequency signal according to the so-called I-Q protocol as known in the art to extract the in-phase I and quadrature Q from which the modulus and phase can then be derived.

Changes in a detected ambient parameter (measurand), for example, a temperature, strain, pressure or torque of a rotating axis, can, thus, be detected either by frequency shifts, possibly different from one peak to another, so the detection can be made either for the absolute or relative frequency values or in the time domain by change of time of flight or by differential phase changes from one echo to another or by both.

When processing in the frequency domain, the frequency band of the sensor is sampled in several consecutively performed steps and the sensor value is determined from the amplitude and phase/frequency differences between the transmitted interrogation radiofrequency signal and the response radiofrequency signal. When processing in the time domain, the frequency band of the sensor is sampled in one single step at once. Therefore, a faster sampling has to be performed in the interrogator but, on the positive side, higher measurement update rates can be obtained. Furthermore, due to time multiplexing between the transmitted interrogation radiofrequency signal and the response radiofrequency signal, a high dynamic range can be achieved.

Although the time domain and the frequency domain are mathematically connected with each other by means of (inverse) Fourier transforms, perturbations (parasites and spurious bursts of noise) may be significantly present in only one of the domains the other one being not heavily affected. Intermittent parasites as, for example, Wi-Fi, BLUETOOTH® or GSM emission, may be present in the frequency domain, but produce only some bursts in the time domain, which do not significantly affect the time domain information, which is reconstructed by inverse Fourier transform, once all the spectral data have been acquired (the interrogator/reader may operate like a vector network analyzer detecting the S11 response). In other situations, permanent white background noise may affect the time domain measurements that do not significantly hide the spectral information. According to the present disclosure depending on the actual interrogation conditions, either the information in the time domain or the information in the frequency domain or the information in both domains can be acquired and used for monitoring a measurand.

Figure 2:
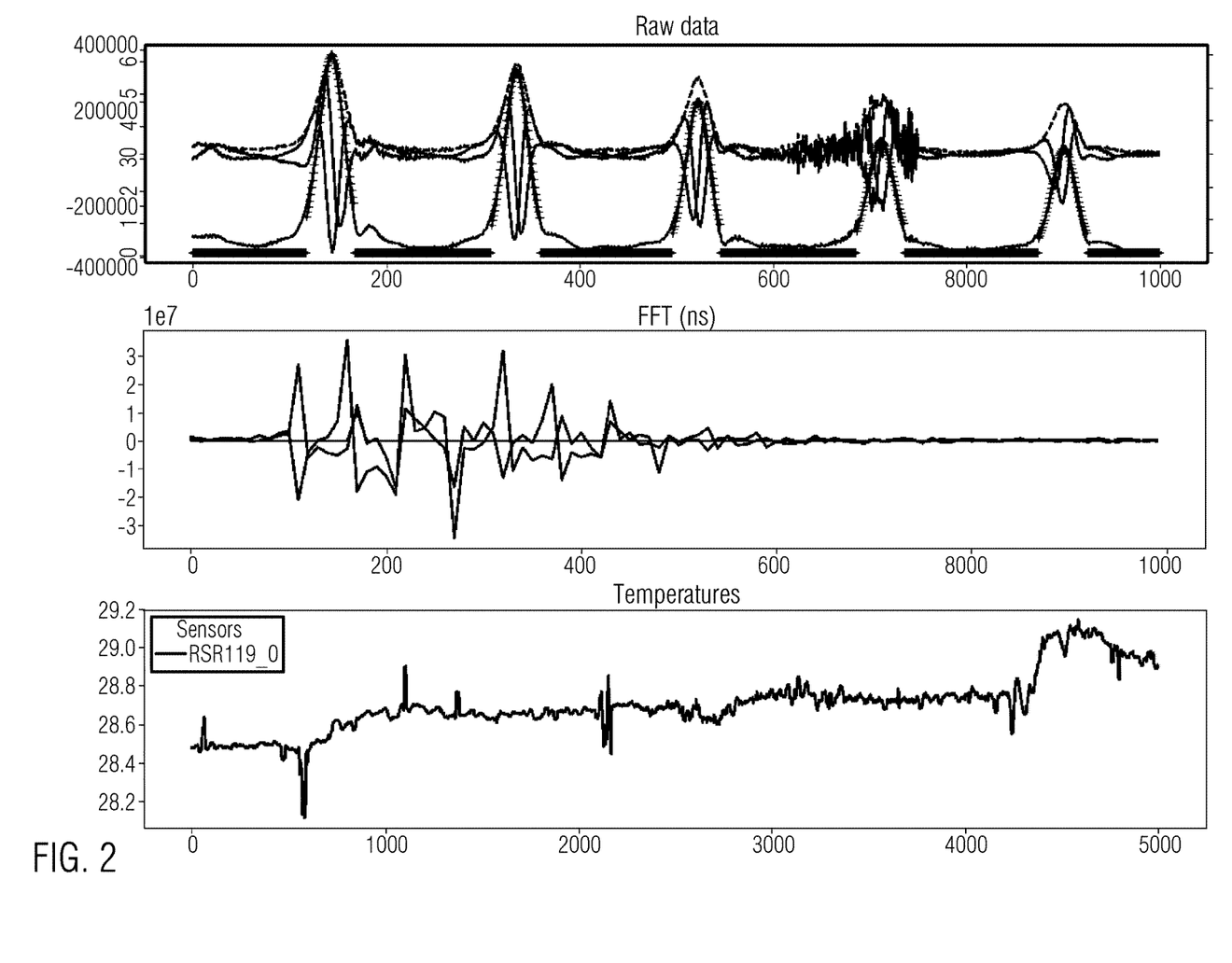
FIG. 2 illustrates the different susceptibility of a response radiofrequency signal provided by an acoustic wave sensor to noise in the time and frequency domains according to an example.

The quality of the measurement can be determined by statistical processing based on the calculation of variances or standard deviations of the in-phase and quadrature values over respective sampling frames and an appropriate thresholding. If the calculated variances or standard deviations exceed some predetermined threshold the measurement is refused for the further processing, i.e., analysis with respect to the determination of an ambient parameter. FIG. 2 illustrates the occurrence of different signatures in the frequency domain and the time domain for a resonator signal. The upper row shows the spectral response in the quadrature and in-phase components of the received response radiofrequency signal, the modulus of these components and an enhanced modulus obtained by some post-processing. The in-phase components are given by I=Y cos φ and the quadrature components by Q=Y sin φ, wherein Y denotes the amplitude and φ the phase, and the modulus is calculated by $$|Y|=\sqrt{I^2+Q^2}$$ [Equation 1]

The resonance peaks can be clearly identified. As can be seen in the upper row of FIG. 2, for the last two resonances, perturbation bursts are present. After thresholding the corresponding frames can be excised. The middle row shows the quadrature and in-phase components in the time domain. These data are not affected by the perturbations that are present in the frequency domain and can directly be used to determine an ambient parameter, in this case the temperature, as shown in the lower row in FIG. 2.

Thresholding in order to excise defective (perturbed) frames can be carried out as follows. The variance or standard deviation of the in-phase components I and the quadrature components Q over a particular entire frame of N sampled frames, for example, the 1st frame, is calculated and represents an initial threshold. For the following frames, again, the variances or standard deviations of the in-phase components I and the quadrature components Q over the respective entire frames are calculated. If the variances or standard deviations for the following frames are decreasing, the threshold value will be updated by the variances or standard deviations of the following frames. When a variance or standard deviation of a following frame is larger than the one of the previous frame, the variance or standard deviation of the previous frame is used as the threshold value. In the subsequently performed analysis, frames that exceed the thus obtained threshold are rejected (defective frames).

It should be noted that the detection sensitivity both in the frequency domain and the time domain as well as both in the delay line approach and the resonator approach is usually limited to a few kHz for bandwidths of a few MHz and some 30 or 50 ns for chronograms of a few μs. In this context, a better sensitivity can be achieved by using the phases of the received response radiofrequency signals. In a coherent system, the phase can be obtained by φ=arctan(Q/I). For example, at 2.45 GHz a variation in the time domain of 0.1 ns translates to π/2 radian. This magnifying effect is present in both the time domain and the frequency domain and can be used both in the delay line approach and the resonator approach and in the latter case similarly for mono-resonant or multi-resonant architectures operating within or out of the allowable Bragg bands. For example, one might measure a measurand based on phase variations measured for resolved peaks in the spectral range directly or differentially and afterwards monitor the temporal evolution of the phase of phase difference between peaks resolved in time in the context of interrogation of multiple sensors. It is noted that ambiguities occur when the phase shifts exceed 360°. This ambiguity problem can be solved, for example, by providing multiple reflectors at known positions and evaluating their phase differences in order to resolve any ambiguities.

Figure 3:
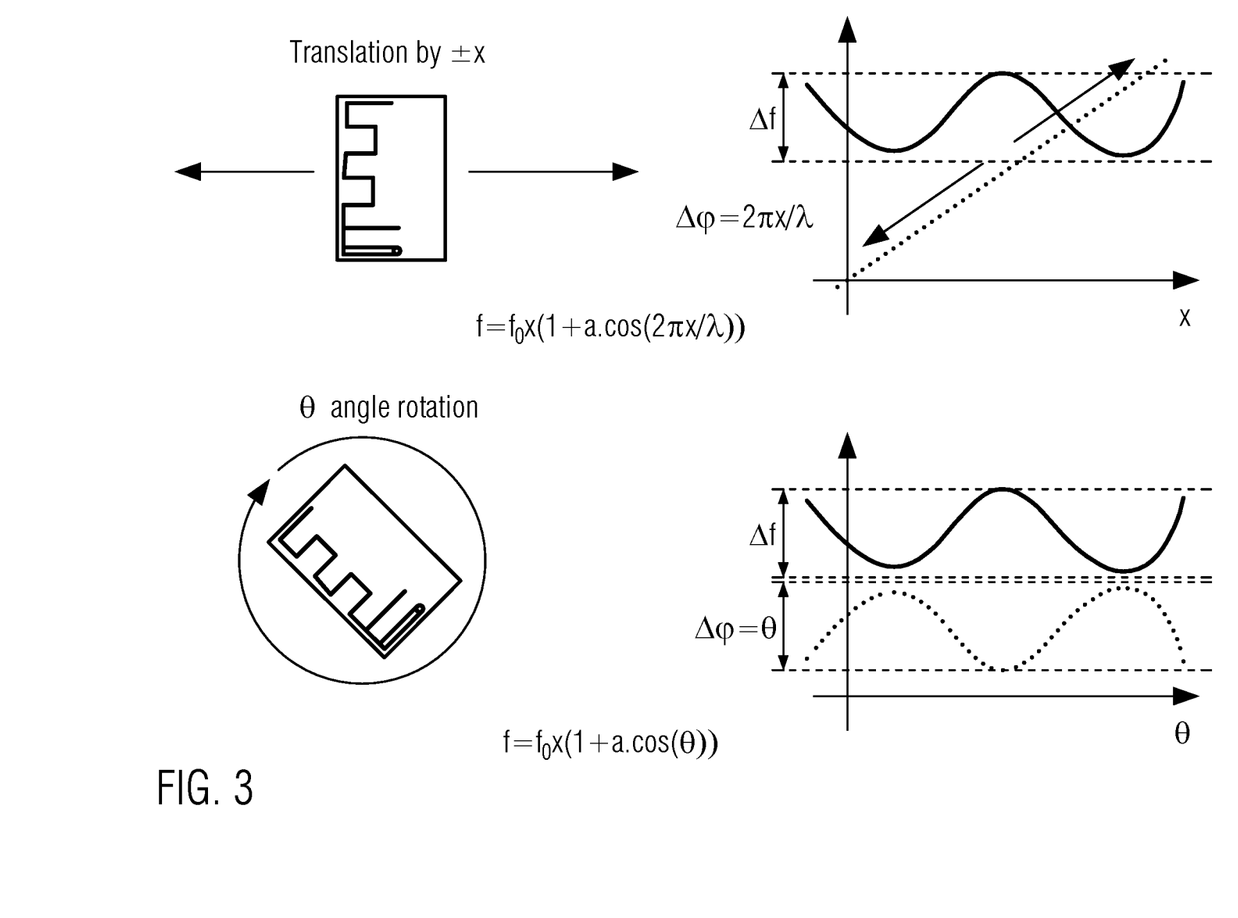
FIG. 3 illustrates the effect of sensor motion on the determined resonance frequency of resonator acoustic wave sensor devices.

Another cause of accuracy limitations of detections by acoustic wave sensor devices lies in sensor motions relative to the interrogator. FIG. 3 illustrates the effects of translational and rotational motions of a resonance sensor on the resonance frequency. In fact, it has been observed that a linear displacement of the sensor by ±x results in a shift of the resonance frequency f0 such that the determined resonance frequency obtained by measurements is given by f=f0(1+a cos(2πx/λ)) with λ being the wavelength. The parameter a can be found experimentally from measurements and depends on the way the antennas are coupled on the interrogator and sensor sides. For example, a is about 18 kHz for a maximum frequency variation around f0=2.45 GHz. Similarly, a rotation of the acoustic wave sensor by θ results in a shift of the resonance frequency f0 such that the determined resonance frequency obtained by measurements is given by f=f0 (1+a cos(θ)). This accuracy problem, in principle, can be solved by a phase shift control of the antenna of the sensor device, using two antennas for the sensor device that are detuned by 180° and/or by moving the acoustic wave sensor in an initialization step by λ/2 and calibrating the resonance frequency to f0=(f0(x)+f0(x+λ/2))/2 to compensate for linear movements.

Actually, as the variation is periodic, when considering two frequency points to opposite phases, the mean value of the two corresponding frequencies is automatically equal to f0: f(x)+f(x+λ/2)=f0 (1+a cos(2πx/λ))+f0(1+a cos(2πx/λ+π))=2f0.

On the other hand, if valid (sufficiently free of perturbations) signals are obtained in the time domain as well as in the frequency domain, the results in the two domains can be compared with each other and checked for coherence of the obtained information. If, for example, some phase rotation is determined from the measurement data in the time domain and no significant deviation of the resonance frequency is determined from the measurement data in the frequency domain, it is concluded that some relative movement of the sensor device with respect to the interrogator has occurred. By unwrapping the phase information the distance the sensor has moved in a translational and/or rotational manner can be determined wherein a translational motion yields changes in the unwrapped phases while rotation yields rotational phase behavior even when the phase is unwrapped.

In fact, when a resonator sensor device is subject to variations of an ambient parameter to be detected, for example, thermal variations, the phase of the time domain echoes, for a linearly behaving sensor device, vary linearly, i.e., the resonance frequency is linearly decreasing in time and, thus, the phase is shifting downwards. The true phase (without periodic −π/+π wrapping) can be obtained by unwrapping the phase resulting in a linear phase change. When moving the sensor toward or away from the interrogator, a similar effect is observed, since the phase rotation in the RF link is accumulated, which affects the sensor similarly. The experimental measurements show that when the sensor is rotating, the phase remains in a range −π/+π such that after unwrapping the phase remains in the range −π/+π.

This is due to the fact that the overall average phase does not really change, if the position of the sensor device remains almost the same (no significant translational motion).

All previously discussed embodiments are not intended as limitations but serve as examples illustrating features and advantages of the present disclosure. It is to be understood that some or all of the above described features can also be combined in different ways.

The invention claimed is:

1. A method of interrogating an acoustic wave sensor, comprising:
    transmitting, by an interrogator, an interrogation radiofrequency signal to the acoustic wave sensor by way of a transmission antenna;
    receiving, by the interrogator, a response radiofrequency signal from the acoustic wave sensor by way of a reception antenna; and
    processing by a processing means of the interrogator the received response radiofrequency signal to obtain in-phase and quadrature components both in a time domain and a frequency domain;
    detecting by the processing means perturbations of the obtained in-phase and quadrature components both in the time domain and the frequency domain;
    determining by the processing means a value of a measurand based on the detected perturbations; and
    wherein the value of the measurand is determined in the time domain if the perturbations in the frequency domain exceed a first predetermined threshold, and the value of the measurand is determined in the frequency domain if the perturbations in the time domain exceed a second predetermined threshold.

2. The method of claim 1, wherein the received response radiofrequency signal is processed in frames, and wherein frames comprising perturbations exceeding a predetermined threshold are excised when determining the value of the measurand.

3. The method of claim 1, wherein the value of the measurand is determined in the time domain or the frequency domain at least partly based on a phase of the received response radiofrequency signal.

4. The method of claim 1, wherein the determining of the perturbations comprises determining variances or standard deviations of the obtained in-phase and quadrature components over respective entire frames.

5. A system for sensing a measurand, comprising:
    an acoustic wave sensor; and
    an interrogator comprising a processing means, a transmission antenna and a reception antenna and configured for transmitting an interrogation radiofrequency signal to the acoustic wave sensor by means of the transmission antenna and for receiving a response radiofrequency signal from the acoustic wave sensor by means of the reception antenna;
    wherein the processing means of the interrogator is configured for processing the received response radiofrequency signal to obtain in-phase and quadrature components both in a time domain and a frequency domain;
    detecting perturbations of the obtained in-phase and quadrature components both in the time domain and the frequency domain;
    determining a value of a measurand based on the detected perturbations; and
    wherein the processing means is configured for determining the value of the measurand in the time domain if the perturbations in the frequency domain exceed a first predetermined threshold, and for determining the value of the measurand in the frequency domain if the detected perturbations in the time domain exceed a second predetermined threshold.

6. The system of claim 5, wherein the processing means is configured for processing the received response radiofrequency signal in frames, and wherein frames comprising perturbations exceeding a predetermined threshold are excised when determining the value of the measurand.

7. The system of claim 5, wherein the processing means is configured for determining the value of the measurand in the time domain or the frequency domain at least partly based on a phase of the received response radiofrequency signal.

8. The system of claim 5, wherein the processing means is configured for determining the perturbations by determining variances or standard deviations of the obtained in-phase and quadrature components over respective entire frames.

9. The system of claim 5, wherein the acoustic wave sensor comprises one transducer configured for converting the interrogation radiofrequency signal into an acoustic wave, two resonance cavities and Bragg mirror structures.

10. The system of claim 9, wherein the one transducer is configured for converting the interrogation radiofrequency signal into a surface acoustic wave.

11. A method of interrogating an acoustic wave sensor, comprising:
    transmitting, by an interrogator, an interrogation radiofrequency signal to the acoustic wave sensor by way of a transmission antenna;
    receiving, by the interrogator, a response radiofrequency signal from the acoustic wave sensor by way of a reception antenna; and
    processing by a processing means of the interrogator the received response radiofrequency signal to obtain in-phase and quadrature components both in a time domain and a frequency domain;
    detecting by the processing means perturbations of the obtained in-phase and quadrature components both in the time domain and the frequency domain; and
    determining by the processing means a value of a measurand based on the detected perturbations; and
    wherein the value of the measurand is determined in the time domain if the perturbations in the frequency domain exceed a first predetermined threshold, and the value of the measurand is determined in the frequency domain if the perturbations in the time domain exceed a second predetermined threshold; and
    wherein, if neither the perturbations in the time domain exceed the second predetermined threshold nor the perturbations in the frequency domain exceed the first predetermined threshold, a translational and/or a rotational motion of the acoustic wave sensor with respect to the interrogator is determined based on the obtained in-phase and quadrature components both in the time domain and the frequency domain.

12. The method of claim 11, wherein the received response radiofrequency signal is processed in frames, and wherein frames comprising perturbations exceeding a predetermined threshold are excised when determining the value of the measurand.

13. The method of claim 11, wherein the determining of the perturbations comprises determining variances or standard deviations of the obtained in-phase and quadrature components over respective entire frames.

14. A system for sensing a measurand, comprising:
    an acoustic wave sensor; and an interrogator comprising a processing means, a transmission antenna and a reception antenna and configured for transmitting an interrogation radiofrequency signal to the acoustic wave sensor by means of the transmission antenna and for receiving a response radiofrequency signal from the acoustic wave sensor by means of the reception antenna;

wherein the processing means of the interrogator is configured for processing the received response radiofrequency signal to obtain in-phase and quadrature components both in a time domain and a frequency domain;

detecting perturbations of the obtained in-phase and quadrature components both in the time domain and the frequency domain; and determining a value of a measurand based on the detected perturbations; and wherein the processing means is configured for determining the value of the measurand in the time domain if the perturbations in the frequency domain exceed a first predetermined threshold, and for determining the value of the measurand in the frequency domain if the detected perturbations in the time domain exceed a second predetermined threshold; and wherein the processing means is configured for determining a translational and/or a rotational motion of the acoustic wave sensor with respect to the interrogator based on the obtained in-phase and quadrature components both in the time domain and the frequency domain, if neither the perturbations in the time domain exceed the second predetermined threshold nor the perturbations in the frequency domain exceed the first predetermined threshold.

15. The system of claim 14, wherein the processing means is configured for processing the received response radiofrequency signal in frames, and wherein frames comprising perturbations exceeding a predetermined threshold are excised when determining the value of the measurand.

16. The system of claim 14, wherein the processing means is configured for determining the perturbations by determining variances or standard deviations of the obtained in-phase and quadrature components over respective entire frames.

17. The system of claim 14, wherein the acoustic wave sensor comprises one transducer configured for converting the interrogation radiofrequency signal into an acoustic wave, two resonance cavities and Bragg mirror structures.

18. The system of claim 17, wherein the one transducer is configured for converting the interrogation radiofrequency signal into a surface acoustic wave.

* * * * *